(12) United States Patent
Sadaka et al.

(10) Patent No.: US 7,241,647 B2
(45) Date of Patent: Jul. 10, 2007

(54) GRADED SEMICONDUCTOR LAYER

(75) Inventors: Mariam G. Sadaka, Austin, TX (US);
Shawn G. Thomas, Gilbert, AZ (US);
Ted R. White, Austin, TX (US);
Chun-Li Liu, Mesa, AZ (US);
Alexander L. Barr, Crolles (FR);
Bich-Yen Nguyen, Austin, TX (US);
Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/919,952

(22) Filed: Aug. 17, 2004

(65) Prior Publication Data

US 2006/0040433 A1    Feb. 23, 2006

(51) Int. Cl.
*H01L 21/00* (2006.01)
(52) U.S. Cl. .............. 438/149; 438/DIG. 933; 438/DIG. 967; 257/E21.093; 257/E21.561
(58) Field of Classification Search .......... 438/47, 438/93, 235, 312, 769, 770, 773, 796, 933, 438/149, 967; 257/E21.561, E21.093
See application file for complete search history.

(56) References Cited

U.S. PATENT DOCUMENTS

| | | | |
|---|---|---|---|
| 3,912,559 A | 10/1975 | Harigaya et al. | |
| 4,851,257 A | 7/1989 | Young et al. | |
| 5,461,243 A | 10/1995 | Ek et al. | |
| 5,534,713 A | 7/1996 | Ismail et al. | |
| 5,759,898 A | 6/1998 | Ek et al. | |
| 5,846,857 A | 12/1998 | Ju | |

(Continued)

FOREIGN PATENT DOCUMENTS

JP    2000243946    12/1999

(Continued)

OTHER PUBLICATIONS

Chi et al., "Electrically active defects in surface preamorphized and subsequently RTP-annealed Si and the effect of titanium silicidation," *Proc. 1998 5th International Conference on Solid-State and Integrated Circuit Technology,*, Oct. 21, 1998, Beijing, China, p. 324-327.

(Continued)

*Primary Examiner*—Michael Lebentritt
*Assistant Examiner*—Stanetta Isaac
(74) *Attorney, Agent, or Firm*—David G. Dolezal; Michael Balconi-Lamica

(57) ABSTRACT

A process for forming a semiconductor device. The process includes forming a template layer for forming a layer of strained silicon. In one example a layer of graded silicon germanium is formed where the germanium is at a higher concentration at the lower portion and at a lower concentration at a top portion. When subject to a condensation process, the germanium of the top portion of the layer diffuses to a remaining portion of the silicon germanium layer. Because the silicon germanium layer has a higher concentration of germanium at lower portions, germanium pile up after condensation may be reduced at the upper portion of the remaining portion of the silicon germanium layer.

29 Claims, 2 Drawing Sheets

U.S. PATENT DOCUMENTS

| | | | |
|---|---|---|---|
| 5,943,565 A | 8/1999 | Ju | |
| 5,998,807 A | 12/1999 | Lustig et al. | |
| 6,059,895 A | 5/2000 | Chu et al. | |
| 6,124,627 A | 9/2000 | Rodder et al. | |
| 6,259,138 B1 | 7/2001 | Ohtani et al. | |
| 6,339,232 B1 | 1/2002 | Takagi | |
| 6,369,438 B1* | 4/2002 | Sugiyama et al. | 257/616 |
| 6,465,316 B2 | 10/2002 | Hattori et al. | |
| 6,524,935 B1 | 2/2003 | Canaperi et al. | |
| 6,562,703 B1* | 5/2003 | Maa et al. | 438/518 |
| 6,583,437 B2* | 6/2003 | Mizuno et al. | 257/19 |
| 6,621,131 B2 | 9/2003 | Murthy et al. | |
| 6,638,802 B1 | 10/2003 | Hwang et al. | |
| 6,709,909 B2* | 3/2004 | Mizuno et al. | 438/167 |
| 6,723,541 B2* | 4/2004 | Sugii et al. | 435/166 |
| 6,743,651 B2* | 6/2004 | Chu et al. | 438/46 |
| 6,831,292 B2 | 12/2004 | Currie et al. | |
| 6,833,332 B2* | 12/2004 | Christiansen et al. | 438/796 |
| 6,855,436 B2 | 2/2005 | Bedell et al. | |
| 6,881,632 B2 | 4/2005 | Fitzgerald et al. | |
| 7,005,676 B2* | 2/2006 | Tezuka et al. | 257/65 |
| 7,022,593 B2* | 4/2006 | Arena et al. | 438/494 |
| 2001/0048119 A1* | 12/2001 | Mizuno et al. | 257/192 |
| 2002/0168802 A1 | 11/2002 | Hsu et al. | |
| 2003/0013305 A1* | 1/2003 | Sugii et al. | 438/689 |
| 2003/0034529 A1 | 2/2003 | Fitzgerald et al. | |
| 2003/0040160 A1 | 2/2003 | Huang et al. | |
| 2004/0175872 A1 | 9/2004 | Yeo et al. | |
| 2004/0242006 A1* | 12/2004 | Bedell et al. | 438/692 |
| 2004/0259334 A1* | 12/2004 | Bedell et al. | 438/478 |
| 2005/0260809 A1* | 11/2005 | Tezuka et al. | 438/199 |

FOREIGN PATENT DOCUMENTS

| | | |
|---|---|---|
| WO | WO 02/33746 A1 | 4/2002 |
| WO | WO 02/45156 A2 | 6/2002 |
| WO | WO 02/45156 A3 | 6/2002 |

OTHER PUBLICATIONS

Fahey et al., "Point defects and dopant diffusion in silicon," *Reviews of Modern Physics*, Apr. 1989, vol. 61, No. 2, pp. 289-384.

Jung et al., "Implementation of Both High-Hole and Electron Mobility in Strained Si/Strained $Si_{1-y}Ge_y$ on Relaxed $Si_{1-x}Ge_x$ (X<y) Virtual Substrate," *IEEE Electron Device Letters*, Letters, vol. 24, No. 7, Jul. 2003, pp. 460-462.

Lee et al., "Sub-30nm P+abrupt junction formation in Strained Si/$Si_{1-x}Ge_x$ MOS device," *Technical Digest of the International Electron Devices Meeting*, Dec. 8, 2002, pp. 379-381.

LeGoues et al., "Kinetics and Mechanism of Oxidation of SiGe: Dry Versus Wet Oxidation," *Applied Physics Letters*, Feb. 13, 1989, vol. 54, No. 7, pp. 644-646.

LeGoues et al., "Oxidation Studies of SiGe," *Journal of Applied Physics*, Feb. 15, 1989, vol. 65, No. 4, pp. 1724-1728.

Lim, Y. S. et al., "Dry Thermal Oxidation of a Graded SiGe Layer", *Applied Physics Letters*, vol. 79, No. 22, Nov. 26, 2001, pp. 3606-3608.

Sawano et al., "Relaxation Enhancement of SiGe Thin Layers by Ion Implantation into Si Substrates," *IEEE*, 2002, pp. 403-404.

Tezuka et al., "Dislocation-free Formation of Relaxed SiGe-on-insulator Layers," *Applied Physics Letters*, May 13, 2002, vol. 80, No. 19, pp. 3560-3562.

Tezuka, T. et al., "Fabrication of Strained Si on an Ultrathin SiGe-on-insulator Virtual Substrate with a High-Ge Fraction", *Applied Physics Letters*, vol. 79, No. 12, Sep. 17, 2001, pp. 1798-1800.

Tezuka et al., "Ultrathin Body SiGe-on-Insulator pMOSFETs with High-Mobility SiGe Surface Channels," *IEEE Transactions on Electron Devices*, vol. 50, No. 5, May 2003, pp. 1328-1333.

Vyatkin et al., "Ion Beam Induced Strain Relaxation in Pseudomorphous Epitaxial SiGe Layers," *IEEE*, 2000, pp. 70-72.

* cited by examiner

GRADED SEMICONDUCTOR LAYER

BACKGROUND OF THE INVENTION

1. Field of the Invention

This invention relates in general to semiconductor devices and in particular to forming semiconductor devices with strained channel regions.

2. Description of the Related Art

Electron and hole motilities may be enhanced with the utilization of strained (e.g. with a bi-axial tensile strain) silicon for the channel region, especially for devices built from wafers having semiconductor or insulator configurations (SOI). A strained silicon layer maybe formed by depositing a layer of silicon on a template layer (e.g. silicon germanium). In some processes, a condensation process is performed on the silicon germanium template to relax the layer prior to the deposition of silicon. One such example of a condensation process includes the oxidization of the silicon germanium template layer. With such a process, a layer of $SiO_2$ is grown on top of the template layer with the germanium of the consumed portion of the template layer diffused into the remaining portion of the silicon germanium layer below to enrich the remaining portion. The oxide is subsequently etched off prior to the deposition of the strained silicon.

One problem that may occur with such a method is that the germanium may not adequately diffuse to the remaining portion of the silicon germanium layer. Accordingly, there may be a relatively high concentration of germanium at the top portion of the remaining layer as opposed to the germanium concentration of the lower portion of the silicon germanium layer. These differences in germanium concentration in the template layer may cause dislocations which could lead to a dysfunctional semiconductor device formed in the area of the dislocations.

What is needed is an improved process for the manufacture of semiconductor devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that providing a layer of template layer material with a graded concentration of germanium may provide for a more uniform grade of germanium after a condensation process has been performed on the layer.

Figure 1:
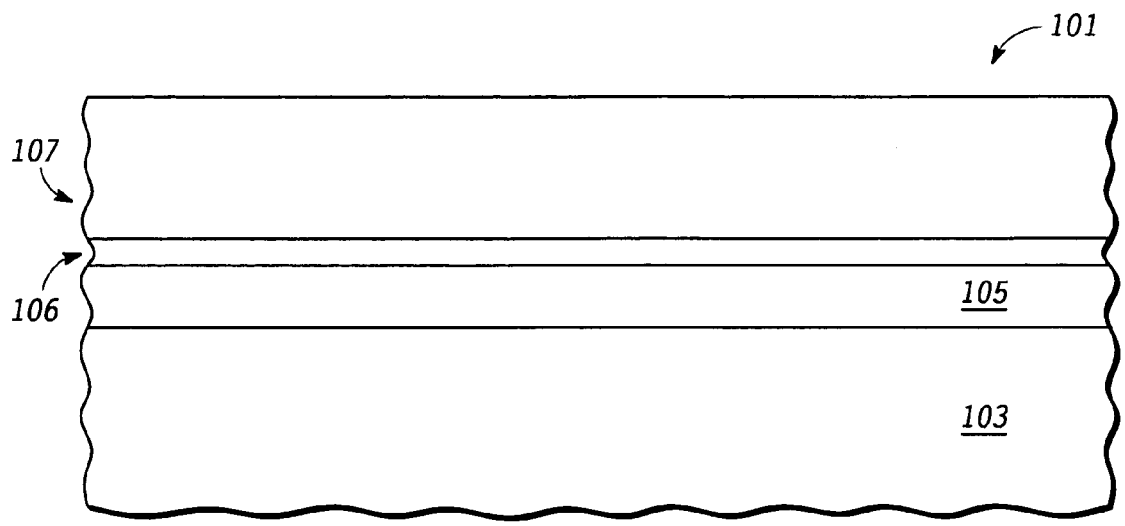
FIG. 1 is a partial cross sectional view of one embodiment of a wafer during a stage in the manufacture of a semiconductor device according to the present invention.

FIG. 1 is a partial cross sectional view of a wafer 101 during a stage in the manufacture of a semiconductor device. In the embodiment shown, wafer 101 includes a semiconductor substrate 103 with an insulator layer 105 (e.g. oxide) located on substrate 103. Silicon layer 106 (e.g. 100 A) is located on insulator layer 105. In one embodiment, layers 106, layer 105, and substrate 103 are formed by a SIMOX process or by bonding one silicon wafer on an oxide layer of another wafer. In the embodiment shown, wafer 101 has a semiconductor on insulator (SOI) configuration. In other embodiments, wafer 101 may have other types of SOI configurations (e.g. silicon on sapphire or quartz).

In the embodiment shown, a silicon germanium layer 107 is formed on silicon layer 106. In the embodiment shown, the germanium concentration of layer 107 is graded from a high concentration at the lower part of layer 107 to a lower concentration at the top portion of layer 107.

In one embodiment, layer 107 is epitaxially grown by a chemical vapor deposition (CVD) process. With one example of such a process, a germanium containing gas (e.g. germane or germanium tetrachloride) and a silicon containing gas (e.g. silane or di-chloro silane) is flowed over layer 106 with a first ratio of germanium gas to silicon containing gas. As the higher portions of layer 107 are formed, the ratio of germanium gas to silicon containing gas is reduced to reduce the germanium concentration of these portions.

In one example, the concentration of germanium is 50% at the bottom of layer 107 and is gradually reduced to 10% at the top of layer 107. However, other embodiments, may have other germanium graded profiles. In other embodiments, the concentration of germanium at the bottom of layer 107 may range from 100% germanium to 10% germanium. The concentration germanium at the top portion of layer 107 may range from 0-20%. However, in other embodiments, layer 107 may have different germanium concentrations at both the top and bottom portions.

In one embodiment, layer 107 has a thickness of 700 A with a grade of germanium from 30% at the bottom to 10% at the top. In other embodiments, layer 107 may be of other thicknesses. In some embodiments, the thickness of layer 107 depends upon the concentration of germanium at the bottom of layer 107 and the concentration of germanium at the top of layer 107, as well as the ability to change the germanium concentration during the CVD process.

In the embodiment shown, the germanium concentration of layer 107 is characterized as back graded in that upper portions have a lower germanium concentration that lower portions. However, in some embodiments, layer 107 may include portions where the germanium concentration is not back graded. For example, in one embodiment, layer 107 may be formed on insulator layer 105 where initially, the germanium concentration is zero but increases rapidly (e.g. 30%). The germanium concentrations of this upper portion would then be back graded to a lower concentration (e.g. 10%) at a top portion.

In some embodiments, the ratio of the germanium containing gas to silicon containing gas in a CVD process may be adjusted linearly or in a step wise fashion. In some embodiments, the number of steps of a step wise process is dependent upon the desired change in germanium concentration.

Figure 2:
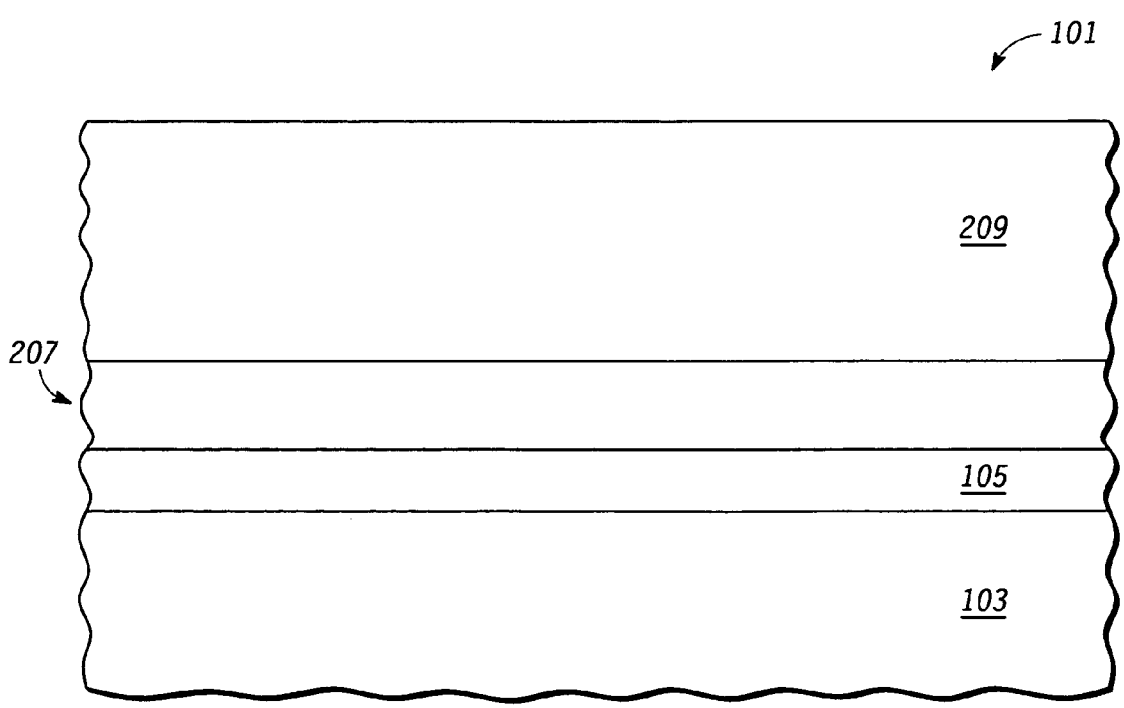
FIG. 2 is a partial cross sectional view of one embodiment of a wafer during another stage in the manufacture of a semiconductor device according to the present invention.

FIG. 2 shows a partial cross sectional view of wafer 101 after a condensation process has been performed on wafer 101. During the condensation process for the embodiment shown, the top portion of layer 107 (see FIG. 1) is consumed to grow a silicon oxide layer 209 on the remaining portion of the silicon germanium layer 207. Also during the condensation process, germanium from layer 107 diffuses into layer 106 (such as layer 106 effectively mergers with the remaining portion of layer 107. Accordingly in FIG. 2, layer 207 includes both layer 106 and the remaining portion of layer 107. In other embodiments, other types of condensation operations may be utilized that increase the germanium concentration in a remaining portion of the layer.

During the condensation process, germanium from the consumed top portion of layer 107 diffuses to the remaining portion (layer 207). Because layer 107 is graded, the concentration of germanium in layer 207 is relatively uniform after the condensation process. As compared with some prior art processes, there is a relative lack of germanium build up at the top portion of layer 207. In one embodiment, the concentration of germanium in layer 207 is about 35%±2% across the thickness of layer 207. However, the resultant germanium concentrations of layer 207 may be of other values in other embodiments and/or of other gradients.

In one embodiment, the condensation process is performed at 1050 C for 30 minutes with 6% HCL gas (e.g. at a 6% concentration). However, other condensation processes at other temperatures (up to 1200 C and above), for other durations, and/or in the presence of other gases. In one embodiment, layer 207 has a thickness of 40 nm.

Another advantage of using a silicon germanium of different concentrations is that it may allow for a condensation process at lower temperatures (e.g. 1050 C as opposed to 1200 C processes in some examples) and/or shorter condensation times. In one embodiment, having a higher concentration of germanium at the bottom portion of layer 107 provides a second driving force for diffusion, where geranium atoms diffuse upward in layer 107 due to the lower concentration of germanium at those higher portions. This second driving force for diffusion is in addition to the driving force of diffusion of germanium from the germanium in the top portion of layer 107 from being consumed due to condensation. One advantage of performing a condensation process at lower temperatures is that it may avoid melting which may occur in layer 207. With some embodiments, the higher concentration of germanium reduces the melting point of silicon germanium. Thus, the ability to perform condensation processes at lower temperatures may be beneficial.

In some embodiments, a silicon cap layer (not shown) may be formed on silicon germanium layer 107 prior to the condensation of layer 107.

Figure 3:
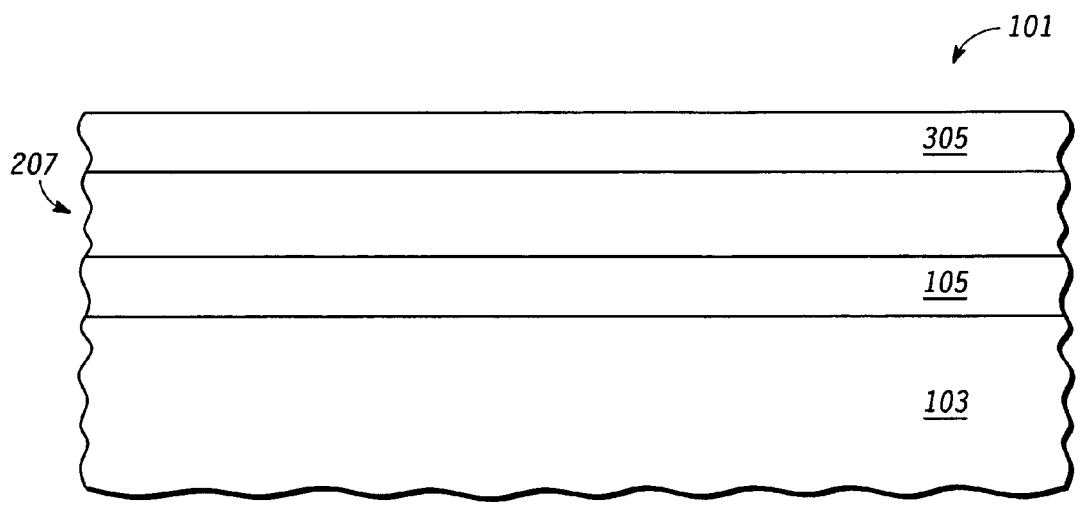
FIG. 3 is a partial cross sectional view of one embodiment of a wafer during another stage in the manufacture of a semiconductor device according to the present invention.

FIG. 3 is a partial cross section of wafer 101 after oxide layer 209 has been removed (e.g. by a HF wet etch) and a layer 305 of strained silicon has been epitaxially deposited on silicon germanium layer 207. Layer 207 serves as a template layer for depositing layer 305 where the lattice of layer 305 generally has the same lattice constant as that of layer 207. In one embodiment, layer 305 has a thickness of 200 A, but may have other thicknesses in other embodiments.

In one embodiment, layer 207 is relaxed after the condensation process. Accordingly, the lattice of silicon layer 305 will have a tensile strain in order to match the lattice constant of layer 207. In other embodiments, layer 207 may have another strain characteristic (e.g. partially relaxed). The strain characteristic of layer 207 is more relaxed than the strain concentration of layer 107.

In some embodiments, other processes may be performed on layer 305 including processes set forth in the application entitled "Template Layer Formation," having a common assignee, having a docket number SC 12851ZP P01, and being filed concurrently, all of which is incorporated by reference in its entirety. Examples of further processes include a post bake with a chorine bearing gas.

Figure 4:
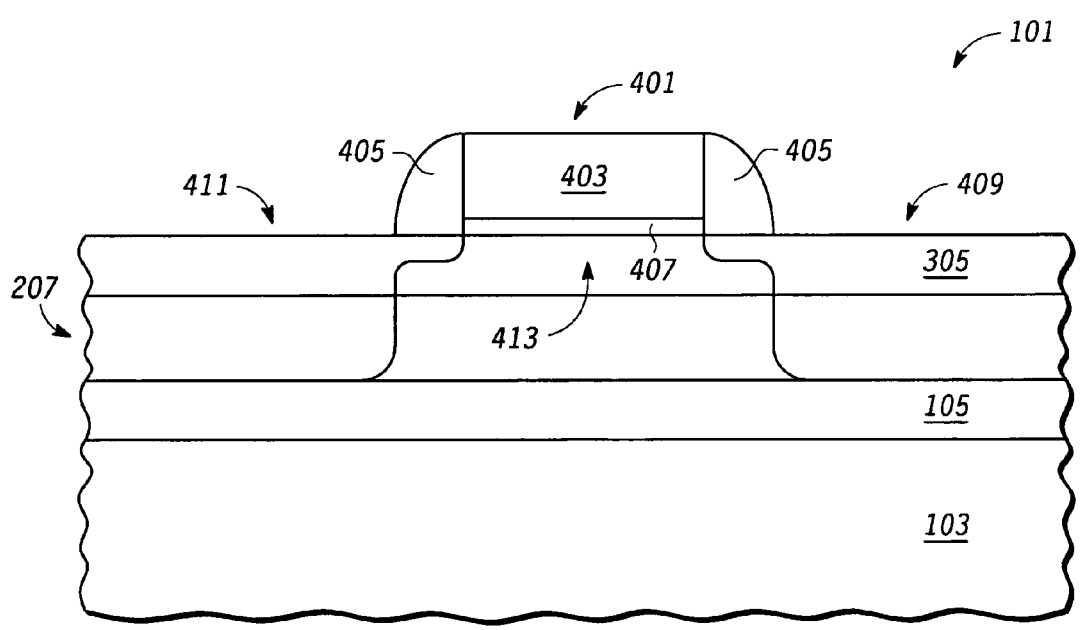
FIG. 4 is a partial cross sectional view of one embodiment of a wafer during another stage in the manufacture of a semiconductor device according to the present invention.

FIG. 4 shows a partial cross sectional view of wafer 101 after the formation of transistor 401. Transistor 401 includes a gate 403 formed on gate oxide 407. Gate oxide 407 is formed on strain silicon layer 305. Transistor 307 also includes a spacer 405 formed over layer 305. In the embodiment shown, transistor 401 includes source/drain regions 411 and 409 formed e.g. by implanting of dopants into layer 305 and 207 at select regions. Transistor 401 includes a channel region 413 formed (in the embodiment shown) in strained silicon layer 305.

In other embodiments, the template layer material may include other components such as carbon as in silicon germanium carbon, silicon tin, and germanium carbon. Wafer 101 may include other transistors (not shown). In some embodiments, layer 107 may be selectively formed on some areas of wafer 101. In other embodiments, layer 107 is formed on all of wafer 101. Also in some embodiments, a condensation process may be selectively performed on all of layer 107. In other embodiments, the condensation process is performed on select areas of the wafer where other areas are masked. For example, it may be desirable for layer 305 to have different strain characteristics in the N-channel regions and P-channel regions.

In one embodiment, a method of forming a semiconductor structure includes providing a wafer having a semiconductor on insulator (SOI) configuration. The wafer includes a first semiconductor layer over an insulator. The first semiconductor layer is made of at least two components. The first semiconductor layer includes a first portion overlying a second portion of the first semiconductor layer. The first portion includes a first concentration of a first component of the at least two components and wherein the second portion includes a second concentration of the first component of the at least two components. The first concentration is less than the second concentration. The method further includes performing a condensation process on the first semiconductor layer to consume a portion of the first semiconductor layer and to form a material including a second component of the at least two components over a remaining portion of the first semiconductor layer. The method also includes removing the material and forming a second semiconductor layer including the second component over the remaining portion after the removing the material.

In another embodiment, a method of forming a semiconductor structure includes providing a wafer. The wafer includes a first semiconductor layer. The first semiconductor layer includes silicon and germanium. The first semiconductor layer includes a first portion having a first concentration of germanium and a second portion having a second concentration of germanium. The first portion overlies the second portion. The first concentration is less than the second concentration. The method also includes performing a condensation process on the first semiconductor layer to consume a portion of the first semiconductor layer and to form a material including silicon overlying a remaining portion of the first semiconductor layer. The method still further includes removing the material including silicon and forming a second semiconductor layer including silicon over the remaining portion after the removing the material including silicon.

In another embodiment, a method of forming a semiconductor device includes providing a wafer having a semiconductor on insulator (SOI) configuration. The wafer includes a first semiconductor layer over an insulator. The first semiconductor layer includes germanium and silicon. The first semiconductor layer includes a first portion of the first semiconductor layer overlying a second portion of the first semiconductor layer. The first portion includes a first concentration of germanium and wherein the second portion includes a second concentration of germanium. The first concentration is less than the second concentration. The method also includes performing an oxidation process on the first semiconductor layer to consume a portion of the first semiconductor layer and to form an oxide on a remaining portion of the first semiconductor layer. The method still further includes removing the oxide and forming a second semiconductor layer including silicon over the remaining portion using the remaining portion as a template layer after the removing the oxide. The method also includes forming a transistor including a channel region. At least a portion of the channel region is located in the second semiconductor layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a semiconductor structure comprising:
   providing a wafer having a semiconductor on insulator (SOI) configuration, the wafer including a first semiconductor layer over an insulator, the first semiconductor layer is made of at least two components, the first semiconductor layer includes a first portion overlying a second portion of the first semiconductor layer, wherein the first portion includes a first concentration of greater than zero percent of a first component of the at least two components and wherein the second portion includes a second concentration of greater than zero percent of the first component of the at least two components, further wherein the first concentration is less than the second concentration; and
   after the providing the wafer, performing a condensation process on the first semiconductor layer to consume a portion of the first semiconductor layer and to form a material including a second component of the at least two components over a remaining portion of the first semiconductor layer;
   removing the material;
   forming a second semiconductor layer including the second component over the remaining portion after the removing the material.

2. The method of claim 1 wherein the forming the second semiconductor layer includes using the remaining portion of the first semiconductor layer as a template layer.

3. The method of claim 1, wherein the first semiconductor layer is formed by flowing a first component containing gas and a second component containing gas at a first ratio over the wafer, and subsequently flowing the first component containing gas and the second component containing gas at a second ratio over the wafer, wherein the first ratio is greater than the second ratio.

4. The method of claim 1, wherein the first semiconductor layer is a chemical vapor deposition (CVD) layer.

5. The method of claim 1, wherein the second semiconductor layer is an epitaxially grown layer.

6. The method of claim 1, wherein the first component is germanium and the second component is silicon.

7. The method of claim 6, wherein the germanium is condensed within the remaining portion of the first semiconductor layer after the condensation process.

8. The method of claim 1, wherein the remaining portion of the fist semiconductor layer is characterized as more relaxed than the first semiconductor layer prior to the performing the condensation process.

9. The method of claim 1, wherein the first and second portions of the first semiconductor layer are part of a back graded portion of the first semiconductor layer of the first component.

10. The method of claim 1 further comprising:
    forming a transistor, the transistor including a channel region, at least a portion the channel region is located in the second semiconductor layer.

11. The method of claim 1, wherein a concentration gradient of the remaining portion includes a substantially uniform distribution of the first component.

12. The method of claim 1, wherein the condensation process produces an oxide of the second component more preferentially than an oxide of the first component.

13. The method of claim 1 wherein the first semiconductor layer includes a third portion located between the first portion and the second portion, the third portion including a third concentration of greater than zero percent of the first component, wherein the third concentration is less than the second concentration but greater than the first concentration.

14. A method of forming a semiconductor structure comprising:
    providing a wafer having a semiconductor on insulator configuration, the wafer includes a first semiconductor layer, wherein the first semiconductor layer is located over an insulator, wherein the first semiconductor layer includes silicon and germanium and wherein the first semiconductor layer includes a first portion having a first concentration of greater than zero percent of germanium and a second portion having a second concentration of greater than zero percent of germanium, wherein the first portion overlies the second portion, and wherein the first concentration is less than the second concentration;
    after the providing the wafer, performing a condensation process on the first semiconductor layer to consume a portion of the first semiconductor layer and to form a material including silicon overlying a remaining portion of the first semiconductor layer;
    removing the material including silicon;
    forming a second semiconductor layer including silicon over the remaining portion after the removing the material including silicon.

15. The method of claim 14 wherein the condensation process includes an oxidation process, wherein the material including silicon includes a silicon oxide.

16. The method of claim 14, wherein the forming the second semiconductor layer further includes using the remaining portion of the first semiconductor layer as a template layer.

17. The method of claim 14, wherein the first semiconductor layer is formed by flowing a silicon containing gas and a germanium component containing gas at a first ratio over the wafer, and subsequently flowing the silicon containing gas and the germanium containing gas at a second ratio over the wafer, wherein the second ratio is greater than the first ratio.

18. The method of claim 17, wherein the remaining portion of the first semiconductor layer is characterized as more relaxed than the first semiconductor layer prior to performing the condensation process.

19. The method of claim 14, wherein the first and second portions of the first semiconductor layer are part of a back graded portion of germanium of the first semiconductor layer.

20. The method of claim 14, wherein a germanium concentration gradient of the remaining portion includes a substantially uniform distribution of germanium.

21. The method of claim 14 further comprising:
    forming a transistor, the transistor including a channel region, at least a portion the channel region is located in the second semiconductor layer.

22. The method of claim 14 wherein the second semiconductor layer is characterized as strained silicon.

23. The method of claim 14, wherein the first portion of the first semiconductor layer is consumed during the performing the condensation process.

24. The method of claim 14 wherein the performing the condensation process on the first semiconductor layer further includes performing the condensation process on a select area of the first semiconductor layer.

25. The method of claim 14 wherein the first semiconductor layer includes a third portion located between the first portion and the second portion, the third portion including a third concentration of greater than zero percent of germanium, wherein the third concentration is less than the second concentration but greater than the first concentration.

26. A method of forming a semiconductor device comprising:
    providing a wafer having a semiconductor on insulator (SOI) configuration, the wafer including a first semiconductor layer over an insulator, the first semiconductor layer including germanium and silicon, the first semiconductor layer including a first portion of the first semiconductor layer overlying a second portion of the first semiconductor layer, wherein the first portion includes a first concentration of greater than zero percent of germanium and wherein the second portion includes a second concentration of greater than zero percent of germanium, further wherein the first concentration is less than the second concentration; and
    after the providing the wafer, performing an oxidation process on the first semiconductor layer to consume a portion of the first semiconductor layer and to form an oxide on a remaining portion of the first semiconductor layer;
    removing the oxide;
    forming a second semiconductor layer including silicon over the remaining portion using the remaining portion as a template layer after the removing the oxide;
    forming a transistor including a channel region, at least a portion of the channel region is located in the second semiconductor layer.

27. The method of claim 26, wherein a germanium concentration gradient of the remaining portion includes a substantially uniform distribution.

28. The method of claim 26, wherein the remaining portion of the first semiconductor layer is characterized as more relaxed than the first semiconductor layer prior to performing the oxidation process.

29. The method of claim 26 wherein the first semiconductor layer includes a third portion located between the first portion and the second portion, the third portion including a third concentration of greater than zero percent of germanium, wherein the third concentration is less than the second concentration but greater than the first concentration.

* * * * *